United States Patent [19]

Sohara et al.

[11] Patent Number: 5,633,532
[45] Date of Patent: May 27, 1997

[54] SEMICONDUCTOR DEVICE INTERCONNECTION

[75] Inventors: Tuyosi Sohara; Hirohisa Matsuki; Toshiyuki Kuramochi, all of Kawasaki, Japan

[73] Assignee: Fujitsu Limited, Kawasaki, Japan

[21] Appl. No.: 426,074

[22] Filed: Apr. 21, 1995

[30] Foreign Application Priority Data

Jun. 23, 1994 [JP] Japan ................................. 6-142034

[51] Int. Cl.⁶ ......................................... H01L 23/053
[52] U.S. Cl. .......................... 257/700; 257/752; 257/759; 257/760; 257/774
[58] Field of Search ......................... 257/700, 723, 257/752, 759, 760, 774, 776

[56] References Cited

U.S. PATENT DOCUMENTS 5,338,975  8/1994  Cole, Jr. et al. ................ 257/700
5,410,107  4/1995  Schaper ........................... 174/255

FOREIGN PATENT DOCUMENTS 4-81879   12/1992  Japan .
4-81878   12/1992  Japan .
5-87977   12/1993  Japan .
92-006496  4/1992  WIPO ........................... 257/700

Primary Examiner—Sara W. Crane
Assistant Examiner—Roy Potter
Attorney, Agent, or Firm—Armstrong, Westerman, Hattori, McLeland & Naughton

[57] ABSTRACT

A semiconductor apparatus includes a semiconductor element and a substrate having a substrate base and a thin-film multilayer interconnection layer formed on the substrate base. The thin-film multilayer interconnection layer has insulating layers and interconnection patterns. The insulating layers and the interconnection patterns are alternately layered. Each of the insulating layers includes a first insulating layer part and a second insulating layer part. A surface of the second insulating layer part is more flat than that of the first insulating layer part, and each of the interconnection patterns is arranged on the surface of the second insulating layer part.

8 Claims, 9 Drawing Sheets $t4 < t3$ $t3: 7\mu m$ $t4: 5\mu m$

SEMICONDUCTOR DEVICE INTERCONNECTION

BACKGROUND OF THE INVENTION

1. Field of the Invention

The present invention generally relates to semiconductor apparatus, and more particularly, to semiconductor apparatus which have multichip module configurations.

2. Description of the Prior Art

Recently, an operating frequency used in electronic devices has been increasing to higher than 100 MHz. Accordingly, it is required that semiconductor devices assembled in the electronic devices can operate at such a higher operating frequency.

To meet this requirement, semiconductor devices having multichip-module configurations, in which bare LSI chips are mounted on thin-film multilayer substrates, are widely used.

FIG. 1 shows a cross-sectional view of a conventional semiconductor device 10 having the multichip-module configuration.

The semiconductor device 10 comprises a ceramic base 11, a thin-film multilayer substrate 12, a bare chip 13, a lead 14, and a wire 15, etc. A plurality of bare chips 13 are mounted on the thin-film multilayer substrate 12 by a flip-chip method. The thin-film multilayer substrate 12 comprises a Si substrate 20 and a thin-film multilayer interconnection layer 21 thereof.

The thin-film multilayer interconnection layer 21 has a decoupling capacitance 22 in a bottom side, a plurality of insulating layers 23 and Cu-interconnection patterns 24 which are alternately formed on the decoupling capacitance 22, and a via 25.

The decoupling capacitance 22 suppresses switching noise generated with an operation of the bare chip 13 to stabilize a voltage Vcc. The decoupling capacitance 22 comprises Cu films 30, 31 as a pair of electrodes, and a dielectric layer 32 between the Cu films 30, 31, and has almost the same size as that of the substrate 20.

The insulating layer 23 is made of a mixed polyimide resin which is mixed with photosensitive material. By mixing with the photosensitive material, a complex synthesis reaction between a photosensitive group and a polyimide is not required. Thus, a less-expensive insulating material is produced, making it possible to reduce a cost of the whole device.

The via 25 has a configuration in which three via parts 35, 36, 37 are overlapped at the same position.

The conventional semiconductor device 10 has problems in the thin-film multilayer interconnection layer 21, namely in the decoupling capacitance 22, the Cu-interconnection layer 24, and the via 25.

i) The problem in the decoupling capacitance 22:

The decoupling capacitance needs to be as large as possible to stabilize the voltage. To enlarge the decoupling capacitance, each of the Cu films 30, 31 has a wide area, and the dielectric layer 32 is thinned as much as possible.

Therefore, pinholes easily occur in the dielectric layer 32, and the pinholes cause the Cu films 30, 31 to short. There is thus a problem that a poor decoupling capacitance easily occurs.

ii) The problem in the Cu-interconnection layer 24:

A surface 23a of the insulating layer 23, on which the Cu-interconnection layer 24 is formed, is a coarse face having a 1- to 2-μm-height fine ruggedness, because the photosensitive material is mixed. The Cu-interconnection layer 24 is formed by sputtering Cu, forming a Cu film, and then etching it. In this process, the fine ruggedness affects the sputtering, thus local dispersion of a film thickness occurs in the Cu film. Also in the interconnection pattern 24 formed by the etching, thin parts are locally generated. Therefore, a volume resistivity is enlarged to several times a theoretical value.

As a result of measuring the volume resistivity of the interconnection pattern 24, the ratio was found to be 5.30 μΩcm. This value is approximately three times the theoretical value of 1.67 μΩcm. Therefore, when the semiconductor device is operative, a temperature of the interconnection pattern 24 increases abnormally. The increases temperature causes migration to grow, and causes a material of the insulating layer 23 to change in quality, so that insulation of the insulating layer 23 is degraded. This degradation of the insulation of the insulating layer 23 may cause an upper-side interconnection pattern 24 and a lower-side interconnection pattern 24 in the insulating layer 23 to short.

In this case, characteristics of the thin-film multilayer substrate 12 depart from designed values, and as a result, performance of the semiconductor device 10 is degraded.

In a worst case, the interconnection pattern 24 is snapped.

iii) The problem in the via 25:

Because the via parts 35, 36, 37 are formed in the same position, according to the via parts being piled, thin parts occur in the via 25 as indicated by a numeral 38. Those thin parts cause a reliability of the via 25 to be reduced.

SUMMARY OF THE INVENTION

It is an object of this invention to provide a semiconductor device comprising a good decoupling capacitance, a good interconnection pattern, and a reliable via, in which the disadvantages described above are eliminated.

The object described above is achieved by a semiconductor device comprising: a semiconductor element; and a substrate having a substrate base and a thin-film multilayer interconnection layer formed on the substrate base, the thin-film multilayer interconnection layer having: insulating layers; and interconnection patterns, the insulating layers and the interconnection patterns being alternately layered; wherein each of the insulating layers comprises: a first insulating-layer part; and a second insulating-layer part formed on the first insulating-layer part; wherein a surface of the second insulating-layer part is more flat than that of the first insulating-layer part, and each of the interconnection patterns is arranged on the surface of the second insulating-layer part.

The object described above is also achieved by the semiconductor device mentioned above, wherein the first insulating-layer part is made of blended resin with which an additive is blended, and the second insulating-layer part is made of an insulating material with which no additive is blended.

The object described above is also achieved by the semiconductor device mentioned above, wherein the second insulating-layer part has a thinner thickness than that of the first insulating-layer.

The object described above is also achieved by the semiconductor device mentioned above, wherein the second insulating-layer part is made of at least one of materials of benzocyclobutene (BCB), polyimide resin, epoxy resin, and spin-on glass (SOG).

The object described above is also achieved by a semiconductor device comprising: a semiconductor element; and a substrate having a substrate base and a thin-film multilayer interconnection layer formed on the substrate, the thin-film multilayer interconnection layer having: insulating layers; interconnection patterns; and a via structure section, the insulating layers and the interconnection patterns being alternately layered; wherein the via structure section comprises: a plurality of pads which are alternately layered with the insulating layers, each of the pads including a plurality of arm parts in a radial manner outwardly, wherein the arm parts of the pads are arranged so as to overlap each other through the insulating layers; and vias, formed in the insulating layers, electrically connecting the arm parts of the pads together, wherein the vias are arranged so as not to overlap each other.

The object described above is also achieved by a semiconductor device comprising: a semiconductor element; and a substrate having a substrate base and a thin-film multilayer interconnection layer formed on the substrate base, the thin-film multilayer interconnection layer having: insulating layers; interconnection patterns; and a decoupling capacitance, the insulating layers and the interconnection patterns being alternately layered; wherein the decoupling capacitance comprises: a pair of interdigital electrodes respectively including tooth parts which are alternately arranged; and a dielectric part filling a gap between adjoining tooth parts.

The object described above is also achieved by the semiconductor device mentioned above, wherein each of the interdigital electrodes comprises a tooth part of a bending form.

According to the semiconductor device, an interconnection pattern is arranged on a flat surface of a coated insulating-layer part. Therefore, a good-quality step-coverage for forming a base film of the interconnection pattern is achieved.

And according to the semiconductor device, since the coated insulating-layer part has a thinner thickness than that of an insulating-layer base, an amount of insulating material used to form the coated insulating-layer part may be reduced.

Further according to the semiconductor device, a material such as BCB, polyimide resin, epoxy resin, and SOG enables a surface of the coated insulating-layer part to be flat.

According to the semiconductor device, the pads for a via having the arm parts in a radial manner outwardly are arranged in the same position. By selecting the arm parts facing each other and electrically connecting between selected arm parts through the via, the vias may be arranged so as not to overlap each other.

According to the semiconductor device, the tooth parts of the interdigital electrodes are alternately arranged dimensionally. Therefore, intervals between adjoining tooth parts may be regularly determined without affection from a dielectric part.

According to the semiconductor device, each of the interdigital electrodes comprises the tooth part of the bending form. Therefore, an area between two tooth parts facing each other may be enlarged.

Other objects and further features of the present invention will be apparent from the following detailed description when read in conjunction with the accompanying drawings.

DESCRIPTION OF THE PREFERRED EMBODIMENTS

Figure 1:
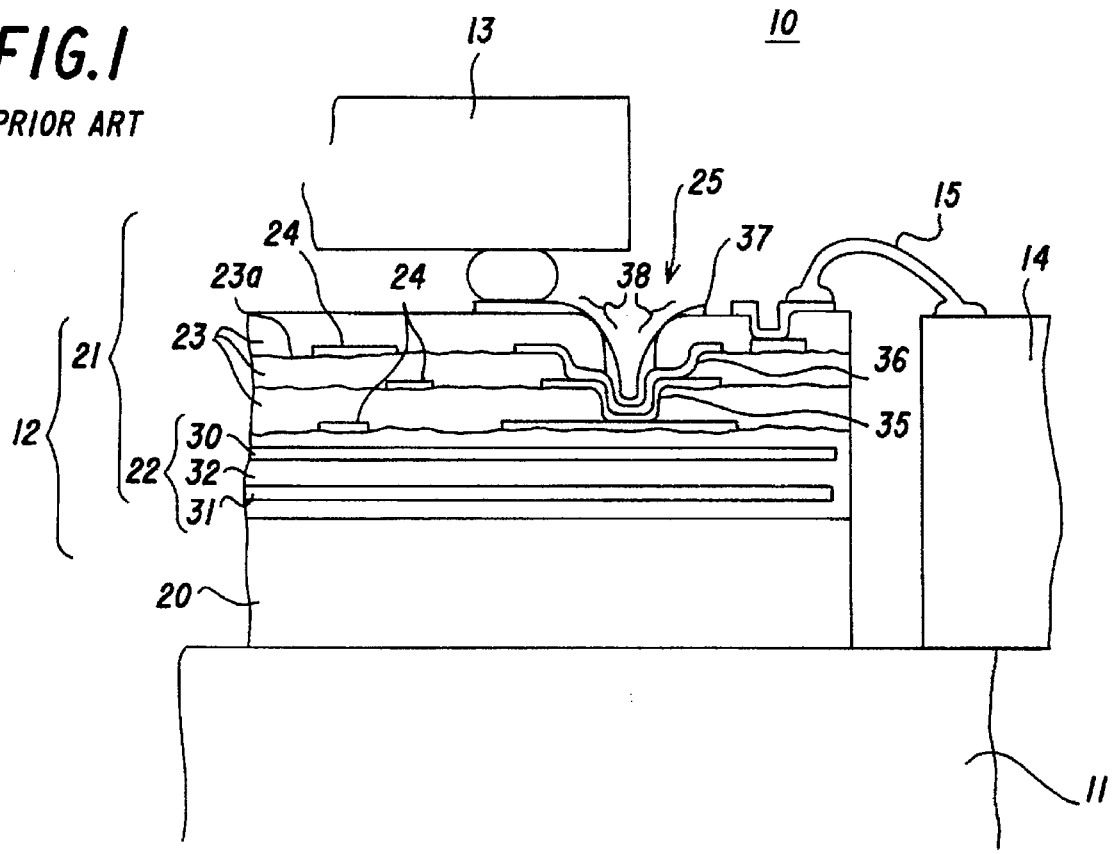
FIG. 1 shows a cross-sectional view of a conventional semiconductor device having a multichip-module configuration.
Figure 2:
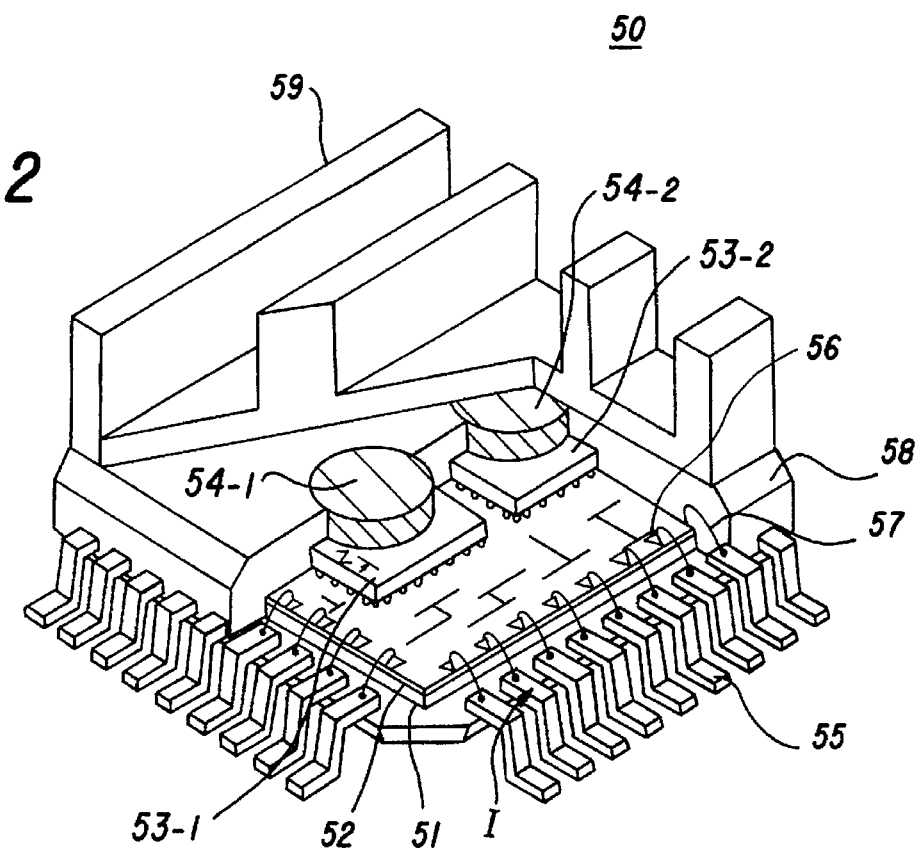
FIG. 2 shows a configuration of a first embodiment of a semiconductor device having the multichip-module configuration with a quad flat package (QFP)
Figure 3:
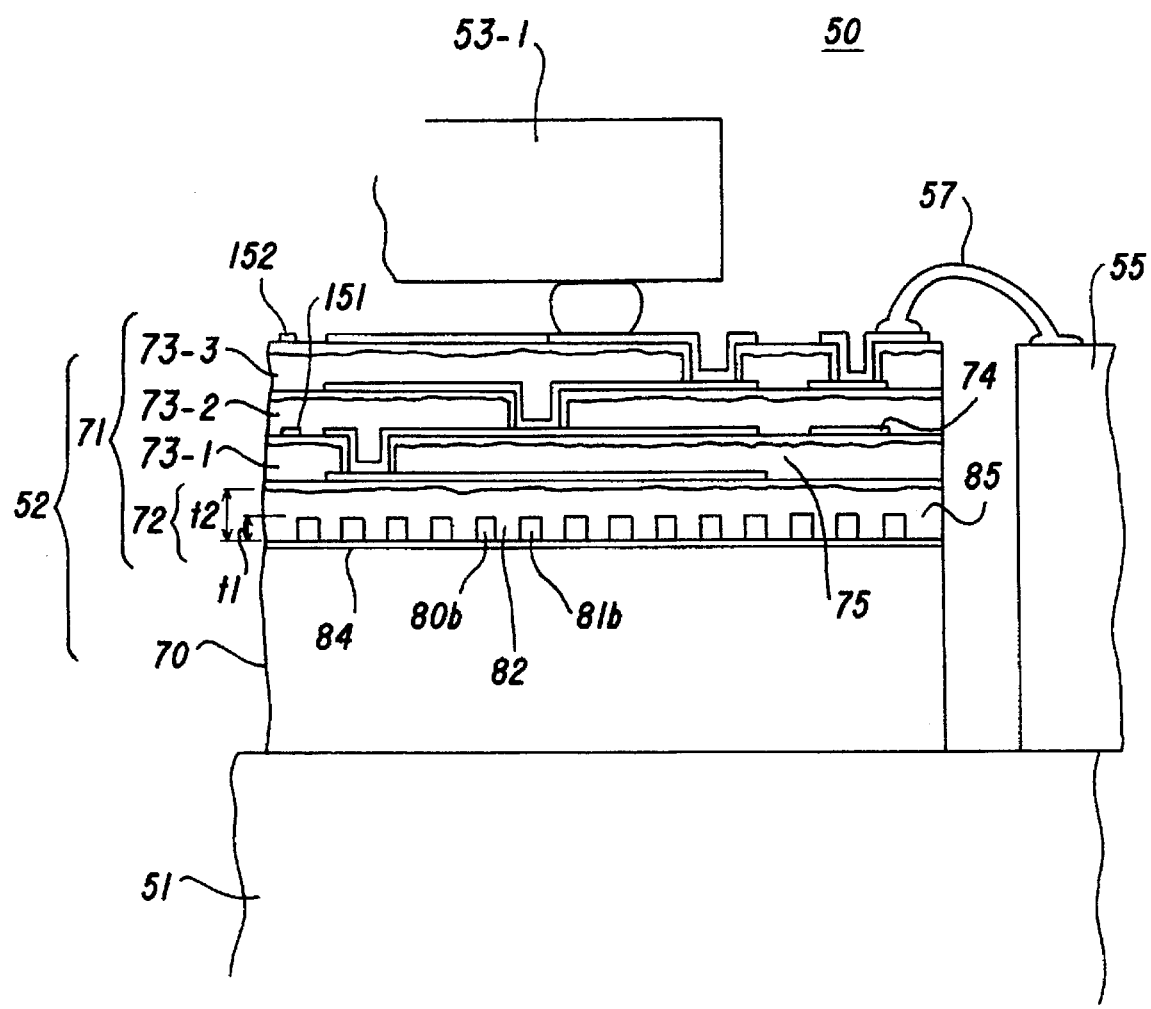
FIG. 3 shows a cross-sectional view of the semiconductor device along a line I—I shown in FIG. 2.

First, a description will be given of a first embodiment of a semiconductor device according to the present invention, by referring to FIGS. 2 and 3. FIG. 2 shows a configuration of the first embodiment of a semiconductor device 50 having a multichip-module configuration with a quad flat package (QFP). FIG. 3 shows a cross-sectional view of the semiconductor device 50 along a line I—I shown in FIG. 2.

As shown in FIGS. 2 and 3, the semiconductor device 50 comprises a ceramic base 51, a thin-film multilayer substrate 52 disposed and fixed on the ceramic substrate 51, two bare chips 53-1, 53-2 mounted on the thin-film multilayer substrate 52 by a flip-chip method, and cooling blocks 54-1, 54-2 disposed on the respective bare chips 53-1, 53-2. The semiconductor device 50 further comprises a large number of leads 55 as ports to be mounted which are arranged along each side of the semiconductor device 50, pads 56 arranged along each side of the thin-film multilayer substrate 52, and wires 57 connecting between the leads 55 and the pads 56. The ceramic base 51, the thin-film multilayer substrate 52, the bare chips 53-1, 53-2, etc., are sealed by a plastic package 58. And a heatsink 59 is fixed on the plastic package 58 to contact with the cooling blocks 54-1, 54-2.

The semiconductor device 50 is mounted on a print board (not shown) by soldering the leads 55.

As shown FIG. 3, the thin-film multilayer substrate 52 comprises a Si substrate 70 and a thin-film multilayer interconnection layer 71 formed on the substrate 70.

The thin-film multilayer interconnection layer 71 has a decoupling capacitance 72 in a bottom side, a plurality of insulating layers 73-1 to 73-3 and Cu-interconnection patterns 74 which are alternately layered on the insulating layers 73-1 to 73-3, and a via structure section 75. For indicating all the insulating layers 73-1 to 73-3, a numeral 73 will be used hereinafter.

The thin-film multilayer interconnection layer 71 of the thin-film multilayer substrate 52 of the semiconductor device 50 according to the present invention has features. Further in detail, these features are in the decoupling capacitance 72, the insulating layer 73, the interconnection pattern 74, and the via structure section 75.

Next, the features according to the present invention will be described.

i) The Decoupling Capacitance 72

Figure 4A:
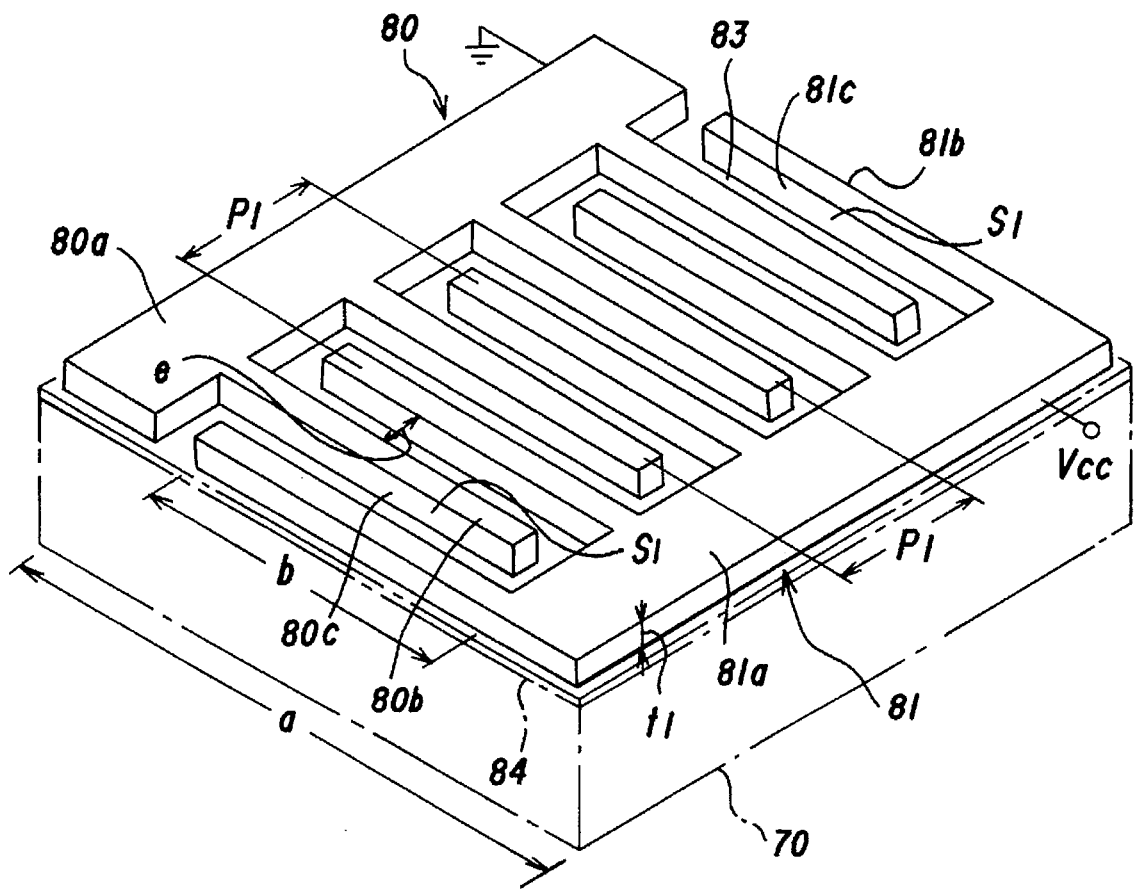
FIG. 4A shows a perspective view of a decoupling capacitance shown in FIG. 3.

FIG. 4A shows a perspective view of the decoupling capacitance 72 shown in FIG. 3. The decoupling capacitance 72 comprises a pair of interdigital electrodes 80, 81, and a dielectric part 82.

The interdigital electrode 80 is grounded, and the interdigital electrode 81 is connected to a Vcc interconnection pattern.

Each of the interdigital electrodes 80, 81 comprises a band-shaped basic part 80a or 81a, and a number of straight tooth parts 80b or 81b which are projected from the band-shaped basic part 80a or 81a, and are arranged with the same interval P1.

In the pair of interdigital electrodes 80, 81, the tooth parts 80b and the tooth parts 81b are alternately arranged. The dielectric part 82 is used to fill a gap 83 between the adjoining tooth parts 80b, 81b. In this case, a side face 80c of the tooth part 80b and a side face 81c of the tooth part 81b faced each other to sandwich the dielectric part 82, and form a capacitance C1. The side faces 80c, 81c have respectively an area S1.

Figure 4B:
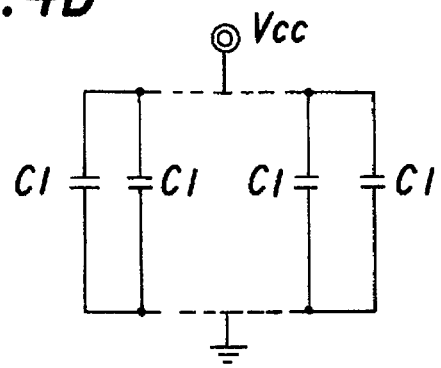
FIG. 4B shows an equivalent circuit of the decoupling capacitance shown in FIG. 4A.

FIG. 4B shows an equivalent circuit of the decoupling capacitance 72 shown in FIG. 4A. The decoupling capacitance 72 has an electrical configuration in which a number of capacitances C1 are arranged in parallel.

In FIG. 4A, each of the tooth parts 80b, 81b has a length b which is almost the same length as a length a of the thin-film multilayer substrate 52. Over the substrate 70, an insulating layer 84 is formed. And the interdigital electrodes 80, 81 are formed on the insulating layer 84 over the substrate 70.

The insulating layer 84 is formed to ensure insulation between the interdigital electrodes 80, 81 and the substrate 70, and to surely prevent the interdigital electrodes 80, 81 and the substrate 70 from reacting. If the above insulation and prevention of the reaction are surely achieved without the insulating layer 84, the insulating layer 84 may be omitted.

Figure 5:
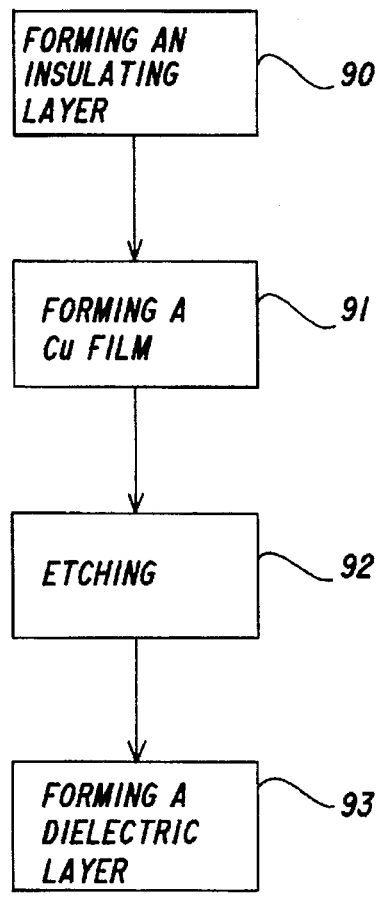
FIG. 5 shows a fabrication method of the decoupling capacitance shown in FIG. 4A.

FIG. 5 shows a fabrication method of the decoupling capacitance 72.

First, in a process 90 for forming an insulating layer, the insulating layer 84 is formed over the substrate 70 by sputtering.

Second, in a process 91 for forming a Cu film, the Cu film is formed over the insulating layer 84 by sputtering.

Third, in an etching process 92, by etching the Cu film, the interdigital electrodes 80, 81 are formed.

Finally, in a process 93 for forming a dielectric layer, the dielectric layer 85 is formed by spreading to a thickness t2 more thick than a thickness t1 of the interdigital electrodes 80, 81.

A portion of the dielectric layer 85, which is used to fill the gap 83, constructs the dielectric part 82.

The above-mentioned decoupling capacitance 72 has the following advantages.

A. A short between the tooth parts 80b, 81b is not likely to occur.

The tooth parts 80b, 81b are arranged in a horizontal direction. Therefore, an interval between adjoining tooth parts 80b, 81b is determined by etching, and a stable configuration of the tooth parts 80b, 81b may be achieved compared to the conventional configuration in which the electrodes are arranged in a vertical direction. Thus, narrow parts are not likely to occur in the gap 83, and initially the tooth part 80b and the tooth part 81b are not likely to be shorted.

B. Repairing is easy.

Since the tooth parts 80b, 81b are arranged in the horizontal direction along the surface of the substrate 70, it is easy to find a point in which the tooth parts 80b, 81b are shorted. At this point, by cutting a basic-part side of the shorted tooth part, the decoupling capacitance 72 having the initial short may be repaired.

C. By the above advantages A and B, a higher yield of the semiconductor device 50 may be achieved compared to the conventional semiconductor device.

ii) The Insulating Layer 73 and the Interconnection Pattern 74

Figure 6:
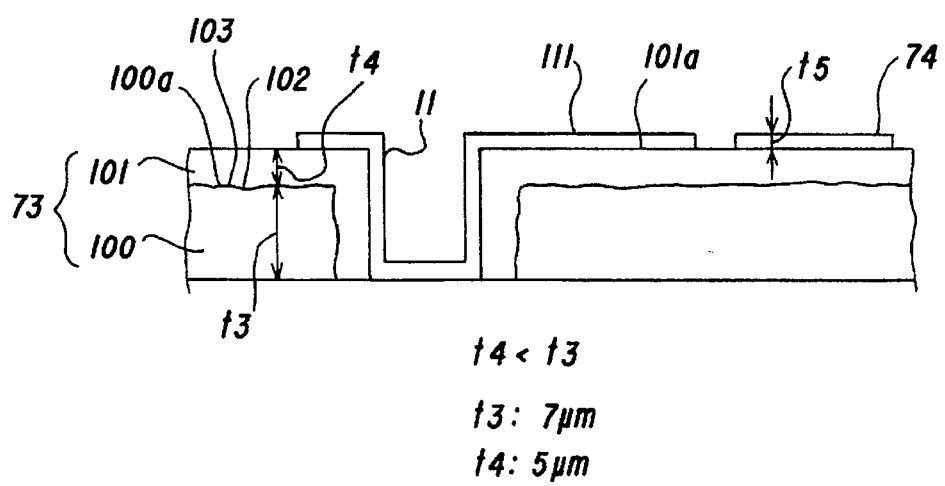
FIG. 6 shows a cross-sectional view of an insulating layer and an interconnection pattern shown in FIG. 3.

FIG. 6 shows a cross-sectional view of the insulating layer 73 and the interconnection pattern 74. The insulating layer 73 has a two-layer structure comprising an insulating layer 100 and a coated insulating-layer part 101 formed on the insulting layer 100.

In the insulating layer 100, a photosensitive material as an additive is blended with a polyimide resin. The insulating layer 100 is a blended polyimide made in the Fujitsu laboratory, and its thickness t3 is 7 µm.

The coated insulating-layer part 101, in which no additive is blended, is a benzocyclobutene (BCB) made at Dow Chemical, and its thickness t4 is 5 µm which is smaller than the thickness t3.

Since the photosensitive material is blended in the insulating layer 100, a surface 100a of the insulating layer 100 has a several-µm-height fine concave part 102 and a several-µm-height fine convex part 103.

The coated insulating-layer part 101 is formed to fill the concave part 102 and to cover the convex part 103. Since no additive is blended with the BCB, the coated insulating-layer part 101 has a flat surface 101a.

On the flat surface 101a of the coated insulating-layer part 101, the interconnection pattern 74 is formed. The interconnection pattern 74 has a thickness t5 of approximately 3 µm, and is constructed with a three-layer structure comprising a 0.1-µm-thickness CrW layer, 3-µm-thickness Cu layer, and 0.1-µm-thickness CrW layer, in that order.

Since a surface on which the interconnection pattern 74 is formed is flat, the interconnection pattern 74 has almost a uniform thickness t5 over the whole pattern and has no local thin parts.

As a result of measuring a volume resistivity of the interconnection pattern 74, the ratio was found to be 1.98 µΩcm. This value is almost the same as the theoretical value of 1.67 µΩcm.

A via 110 and a pad for a via 111 are also formed on the flat surface 101a, and each of them have a uniform thickness.

In the following, a description will be given of procedures for fabricating the interconnection pattern 74, the via 110, and the pad for a via 111.

FIGS. 7A to 7F show the procedures for fabricating the interconnection pattern 74 and the insulating layer 73 with the via 110.

Figure 7A:
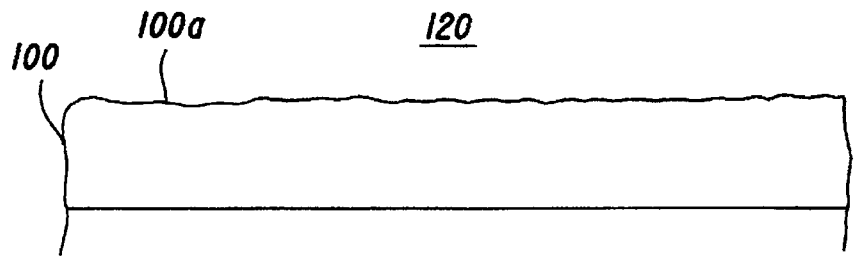
FIGS. 7A to 7F show procedures for fabricating the interconnection pattern and the insulating layer with a via shown in FIG. 6.

1) A process 120 for forming the insulating layer 100 (refer to FIG. 7A).

The insulating layer 100 is formed by spreading the blended polyimide made in the Fujitsu laboratory.

Figure 7B:
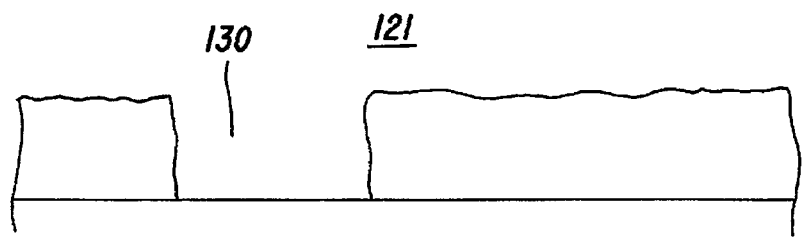

2) A process 121 for patterning (refer to FIG. 7B).

A hole 130 is made in a position where the via is to be formed, by exposing and developing.

Figure 7C:
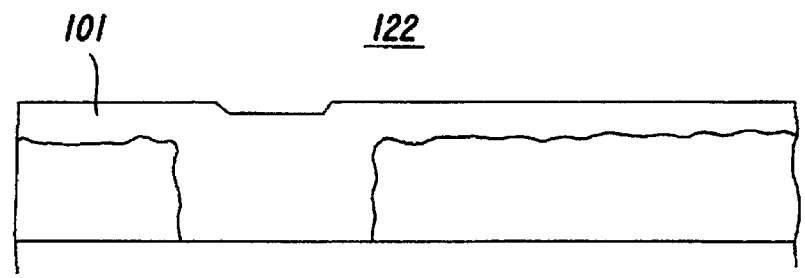

3) A process 122 for forming the coated insulating-layer part 101 (refer to FIG. 7C).

The coated insulating-layer part 101 is formed by spreading the BCB made by Dow Chemical.

Figure 7D:
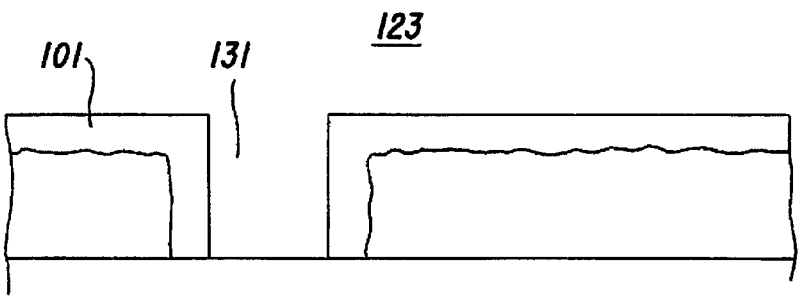

4) A process 123 for patterning (refer to FIG. 7D).

A hole 131 is made in a position where the via is to be formed, by exposing and developing.

Figure 7E:
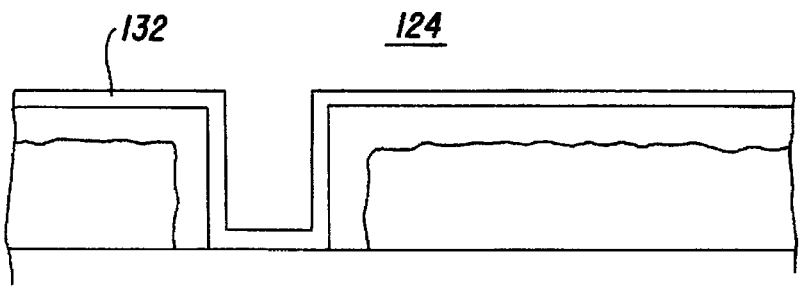

5) A process 124 for forming a conductive film (refer to FIG. 7E).

A conductive film 132 is formed by sputtering in sequence CrW, Cu, and CrW.

Figure 7F:
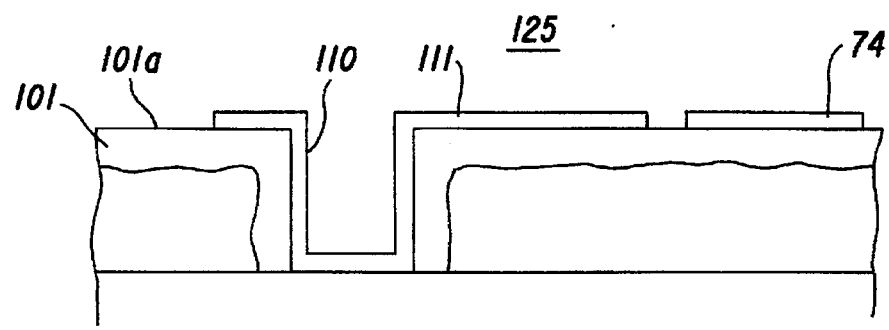

6) A process 125 for patterning (refer to FIG. 7F).

The interconnection pattern 74, the via 110, and the pad for a via 111 are formed by exposing and developing.

The above-mentioned insulating layer 73 and the interconnection pattern 74 have the following advantages.

a. Since the interconnection pattern 74 has no local thin parts, it may have almost the same volume resistivity as the theoretical value. Therefore, the interconnection pattern 74 may be prevented from abnormally generating heat as well as from being snapped. In the absence of abnormal heat evolution, migration is not likely to occur. Therefore, an insulation of the insulating layer is not degraded, and the above may surely prevent the upper-side and the lower-side interconnection patterns in the insulating layer from shorting for a long time. As a result, the semiconductor device 50 may go on operating in a stable condition for a long period.

Further, the thin-film multilayer substrate 52 has the characteristics close to the designed values, so that the semiconductor device 50 also may have almost the same characteristics as the designed values.

b. Since the thickness t4 of the coated insulating-layer part 101 is smaller than the thickness t3 of the insulating layer 100, an amount used of the BCB made by Dow Chemical, which is more expensive than the blended polyimide made in the Fujitsu laboratory, may be reduced. Therefore, the semiconductor device 50 may be less expensive.

iii) The Via Structure Section 75

Figure 8:
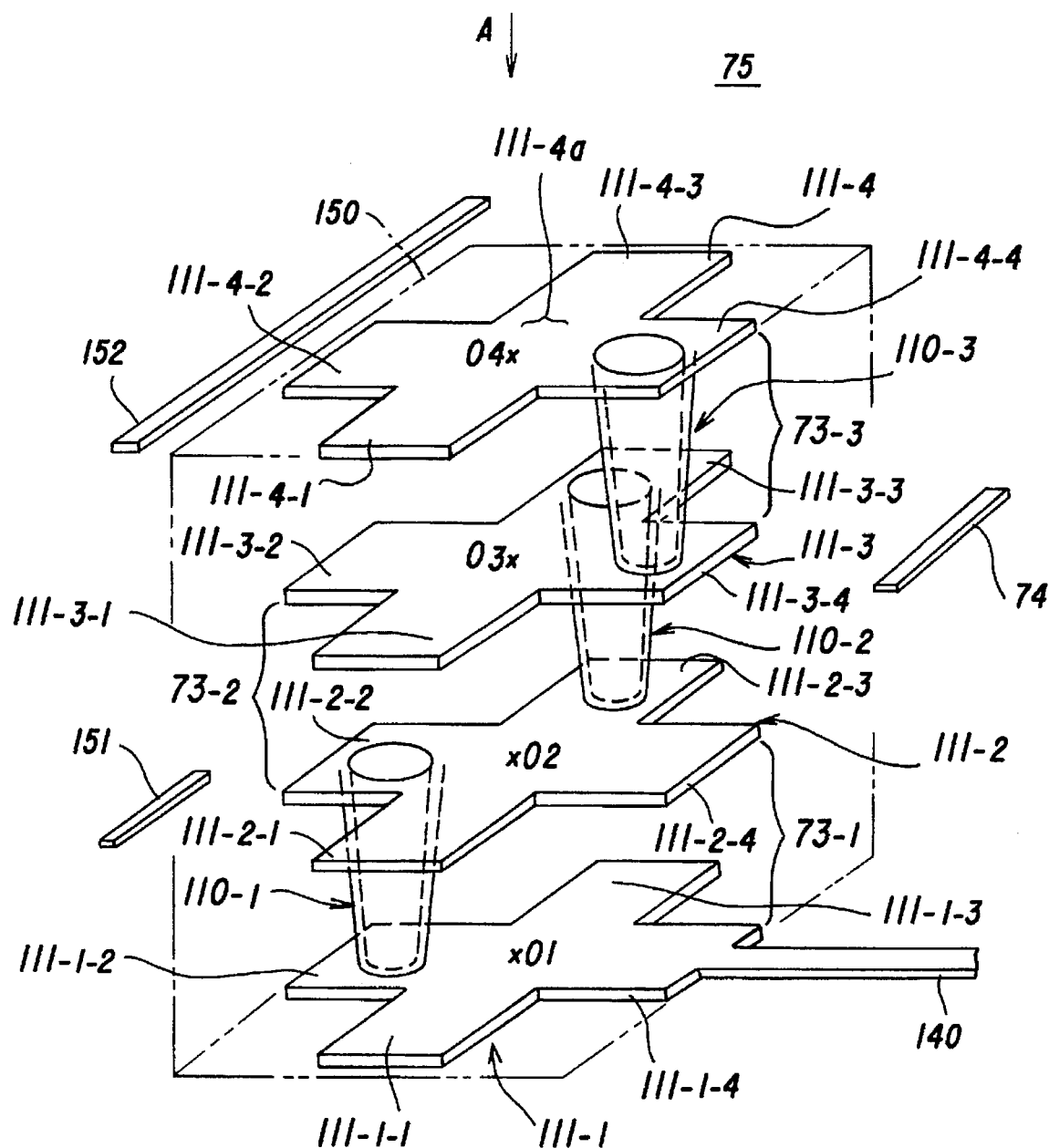
FIG. 8 shows an expanded view of a via structure section shown in FIG. 3.

FIG. 8 shows a perspective view of the via structure section 75. The via structure section 75 comprises a first pad for a via 111-1 to a fourth pad for a via 111-4, and a first via 110-1 to a third via 110-3.

The pads for a via 111-1 to 111-4 are respectively formed in a cross-shaped form, and have arm parts 111-1-1 to 111-1-4, to 111-4-1 to 111-4-4, respectively. Respective arm parts have a radial direction for the pads and all arm parts have the same size.

The first pad for a via 111-1 is arranged on the dielectric layer 85, the second pad for a via 111-2 is arranged on the insulating layer 73-1, the third pad for a via 111-3 is arranged on the insulating layer 73-2, and the fourth pad for a via 111-4 is arranged on the insulating layer 73-3. In this configuration, central points O1, O2, O3, O4 of the pads for a via 111-1 to 111-4 are arranged on a same point, and the arm parts 111-1-1, 111-2-1, 111-3-1, 111-4-1 are arranged on the same position, other arm parts being also arranged in the same way.

From the arm part 111-1-4 of the first pad for a via 111-1, an interconnection pattern 140 is extended.

The first via 110-1 penetrating the insulating layer 73-1 is formed between the arm part 111-2-2 of the second pad for a via 111-2 and the arm part 111-1-2 of the first pad for a via 111-1.

The second via 110-2 penetrating the insulating layer 73-2 is formed between the arm part 111-3-3 of the third pad for a via 111-3 and the arm part 111-2-3 of the second pad for a via 111-2.

The third via 110-3 penetrating the insulating layer 73-3 is formed between the arm part 111-4-4 of the fourth pad for a via 111-4 and the arm part 111-3-4 of the third pad for a via 111-3.

The fourth pad for a via 111-4 includes a pad part 111-4a for mounting a bare chip, which part is electrically connected with the first pad for a via 111-1 through the third via 110-3, the third pad for a via 111-3, the second via 110-2, the second pad for a via 111-2, and the first via 110-1.

In a view from an upper side of the semiconductor device 50, namely in a view in an arrow A direction, a position of the second via 110-2 is shifted from a position of the first via 110-1. And a position of the third via 110-3 is shifted from positions of the first via 110-1 and the second via 110-2.

Therefore, the second via 110-2 is formed without influence from the first via 110-1. Thus, the second via 110-2 may have almost the same shape and film thickness as designed values.

Further, the third via 110-3 is also formed without influence from the second via 110-2 and the first via 110-1. Thus, the third via 110-3 may also have almost the same shape and film thickness as designed values.

Since no vias are formed under the first via 110-1, the first via 110-1 may also have almost the same shape and film thickness as designed values.

Now, a space 150 of a square shape including the pads for a via 111-1 to 111-4 is assumed. And passes of interconnection patterns formed on each of the insulating layers 73-1 to 73-3 will be discussed.

The cross-shaped form of each of the pads for a via 111-1 to 111-4 restricts where the interconnection patterns are formed. Therefore, the interconnection patterns 74, 151, 152 are not formed so as to penetrate the space 150, but are formed so as to pass around the space 150.

In the view in the arrow A direction, the interconnection pattern 151 on the insulating layer 73-1 does not overlap with the pads for a via 111-1, 111-3, 111-4, and therefore, no parasitic capacitance occurs between the interconnection pattern 151 and the pads for a via 111-1, 111-3, 111-4.

In the same way mentioned above, the interconnection pattern 152 on the insulating layer 73-2 does not overlap with the pads for a via 111-1, 111-2, 111-4, and therefore, no parasitic capacitance occurs between the interconnection pattern 152 and the pads for a via 111-1, 111-2, 111-4.

In the same way mentioned above, the interconnection pattern 153 on the insulating layer 73-3 does not overlap with the pads for a via 111-1, 111-2, 111-3, and therefore, no parasitic capacitance occurs between the interconnection pattern 153 and the pads for a via 111-1, 111-2, 111-3.

Next, a description will be given of a fabricating method of the via structure section 75, by referring to FIGS. 9A to 9G. FIGS. 9A to 9G show a method for fabricating the via structure section 75. The via structure section 75 is fabricated in the following processes 160 to 166.

Figure 9A:
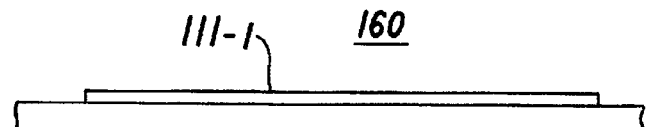
FIGS. 9A to 9G show a method for fabricating the via structure section shown in FIG. 8.

1) A process 160 for forming the first pad for a via 111-1 (refer to FIG. 9A).

The first pad for a via 111-1 is formed in the cross-shaped form by forming a film and etching it.

Figure 9B:
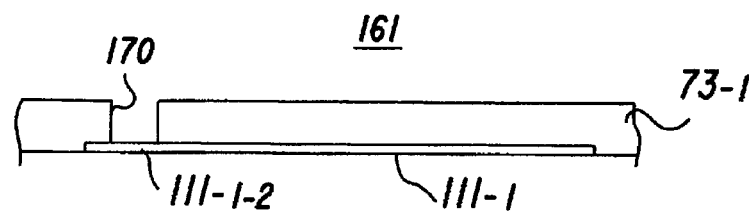

2) A process 161 for forming the first insulating layer 73-1 (refer to FIG. 9B).

The first insulating layer 73-1 is formed so as to cover the first pad for a via 111-1. And the first insulating layer 73-1 has a through hole 170 on the arm part 111-1-2 of the first pad for a via 111-1.

Figure 9C:
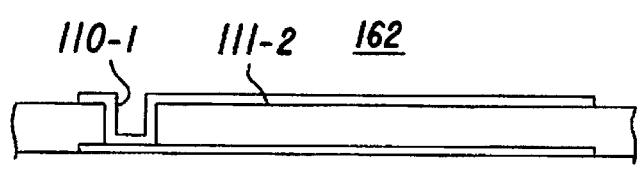

3) A process 162 for forming the second pad for a via 111-2 (refer to FIG. 9C).

The second pad for a via 111-2 is formed just over the first pad for a via 111-1. At the same time, the first via 110-1 is also formed inside the through hole 170.

Figure 9D:
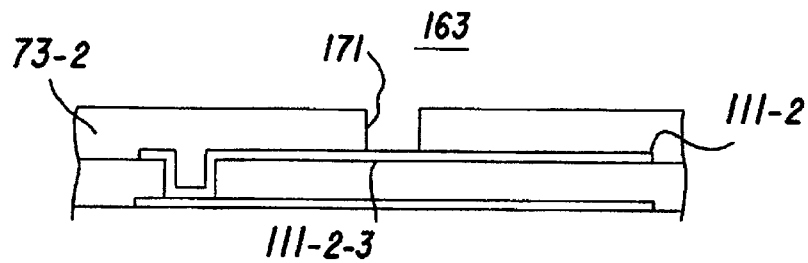

4) A process 163 for forming the second insulating layer 73-2 (refer to FIG. 9D).

The second insulating layer 73-2 is formed so as to cover the second pad for a via 111-2. And the second insulating layer 73-2 has a through hole 171 on the arm part 111-2-3 of the second pad for a via 111-2.

Figure 9E:
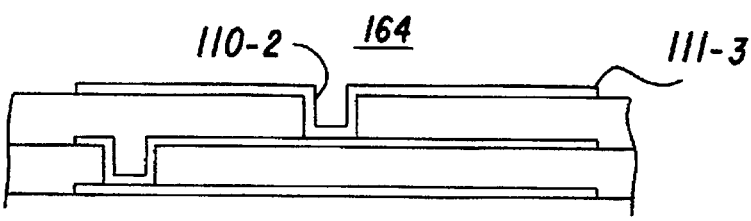

5) A process 164 for forming the third pad for a via 111-3 (refer to FIG. 9E).

The third pad for a via 111-3 is formed just over the second pad for a via 111-2. At the same time, the second via 110-2 is also formed inside the through hole 171.

Figure 9F:
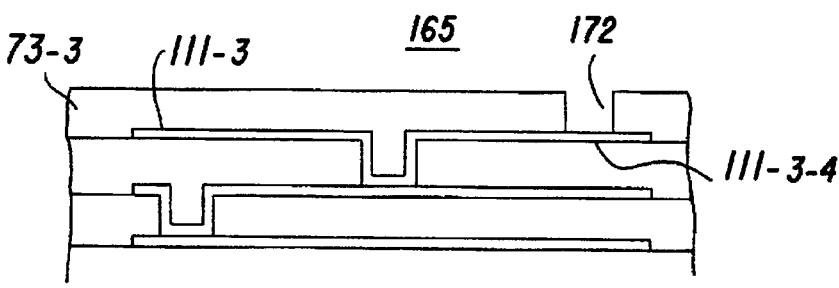

6) A process 165 for forming the third insulating layer 73-3 (refer to FIG. 9F).

The third insulating layer 73-3 is formed so as to cover the third pad for a via 111-3. And the third insulating layer 73-3 has a through hole 172 on the arm part 111-3-4 of the third pad for a via 111-3.

Figure 9G:
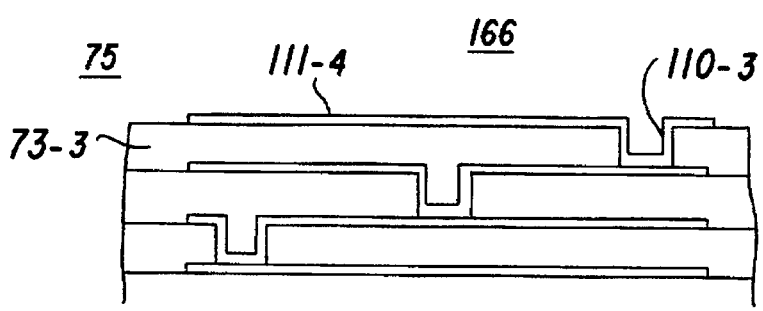

7) A process 166 for forming the fourth pad for a via 111-4 (refer to FIG. 9G).

The fourth pad for a via 111-4 is formed just over the third pad for a via 111-3. At the same time, the third via 110-3 is also formed inside the through hole 172.

In this way, the via structure section 75 is performed.

The via structure section 75 has the following advantages.

A. Each of the vias 110-1 to 110-3 may have almost the same shape and film-thickness as designed values. And the vias 110-1 to 110-3 may perform sure electrical connections. Therefore, the via structure section 75 may have a high reliability for electrical conductivity.

B. The interconnection patterns 151, 152, 153 are formed without the parasitic capacitance being generated between their patterns and the pads for a via 111-1 to 111-4. Therefore, in a transmission of a high-frequency signal, generation of cross-talk noise may be prevented. Thus, the semiconductor device 50 may be operative with a high reliability.

The semiconductor device 50 shown in FIGS. 2 and 3 comprises the decoupling capacitance 72, the insulating layers 73-1 to 73-3, the interconnection pattern 74, and the via structure section 75. Therefore, the semiconductor device 50 has the following advantages as compared to the conventional semiconductor device.

A. High yield may be achieved for fabricating the semiconductor device 50.

B. The semiconductor device 50 may have a high reliability.

C. The semiconductor device 50 may have superior high-frequency transmission performance.

Next, descriptions will be given of modifications of the decoupling capacitance 72, the insulating layers 73-1 to 73-3, the interconnection pattern 74, and the via structure section 75.

i) Modifications of the Decoupling Capacitance 72

1. A First Modification

Figure 10:
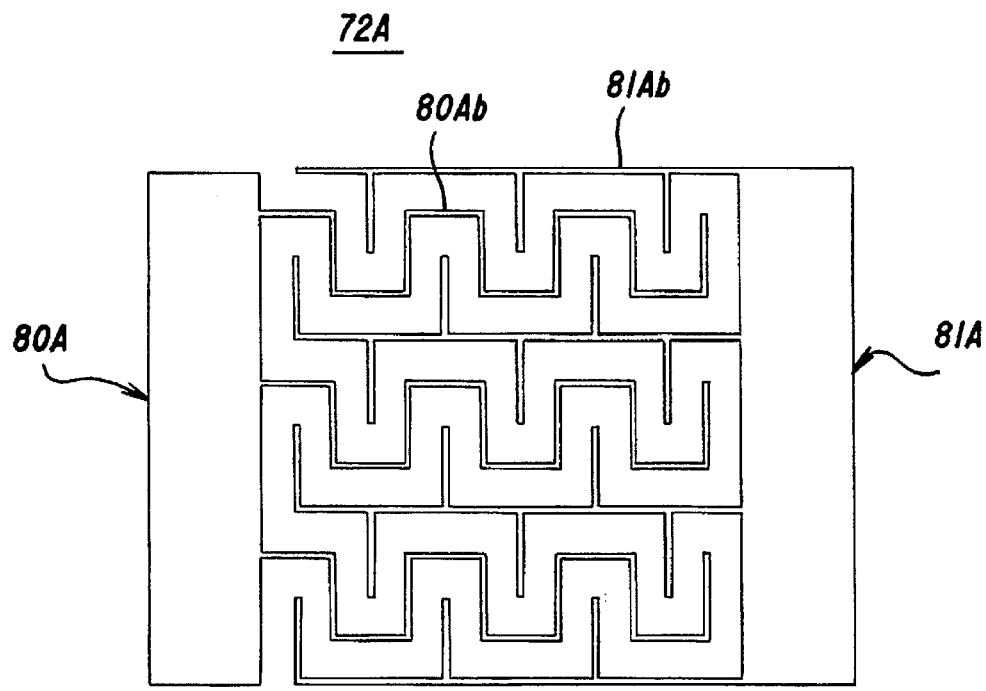
FIG. 10 shows a first modification of the decoupling capacitance shown in FIG. 4.

FIG. 10 shows a first modification of the decoupling capacitance 72. A decoupling capacitance 72A as the first modification comprises interdigital electrodes 80A, 81A. The interdigital electrode 80A has tooth parts 80A$b$ having a rectangular-wave shape, and the interdigital electrode 81A has tooth parts 81A$b$ having branches.

The tooth parts 80A$b$ are alternately facing the tooth parts 81A$b$. An area along between the tooth part 80A$b$ and the tooth part 81A$b$ is wider than that of straight tooth parts. Therefore, the decoupling capacitance 72A has a larger capacitance compared to the decoupling capacitance 72 shown in FIG. 4A.

2. A Second Modification

Figure 11:
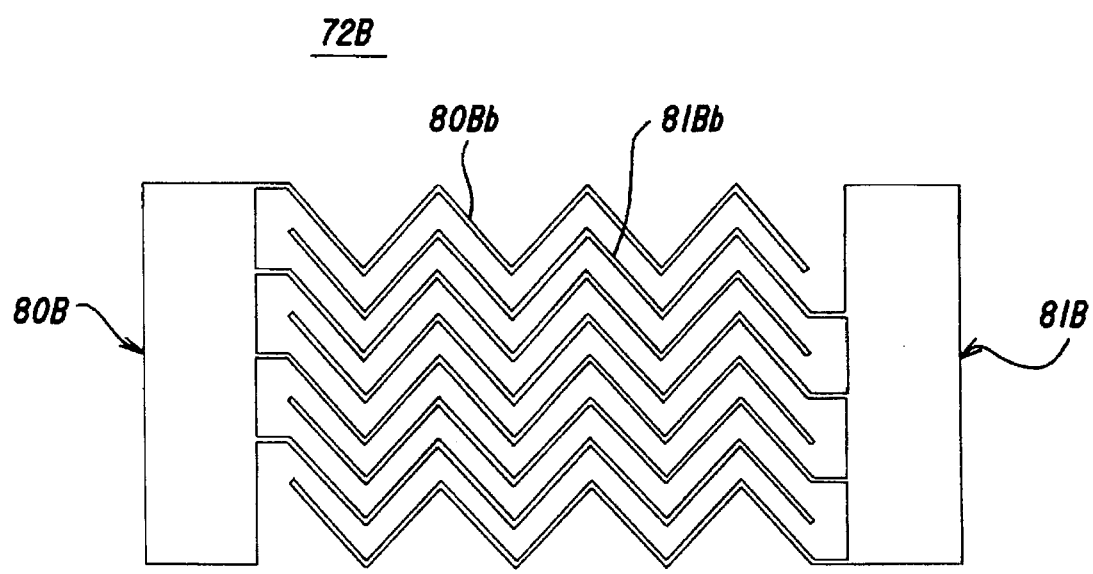
FIG. 11 shows a second modification of the decoupling capacitance shown in FIG. 4.

FIG. 11 shows a second modification of the decoupling capacitance 72. A decoupling capacitance 72B as the second modification comprises interdigital electrodes 80B, 81B. The interdigital electrode 80B has tooth parts 80B$b$ having a triangular-wave shape, and the interdigital electrode 81B has tooth parts 81B$b$ also having the triangular-wave shape.

The tooth parts 80B$b$ are alternately facing the tooth parts 81B$b$. An area along between the tooth part 80B$b$ and the tooth part 81B$b$ is wider than that of the straight tooth parts. Therefore, the decoupling capacitance 72B has a larger capacitance compared to the decoupling capacitance 72 shown in FIG. 4A.

3. A Third Modification

Figure 12:
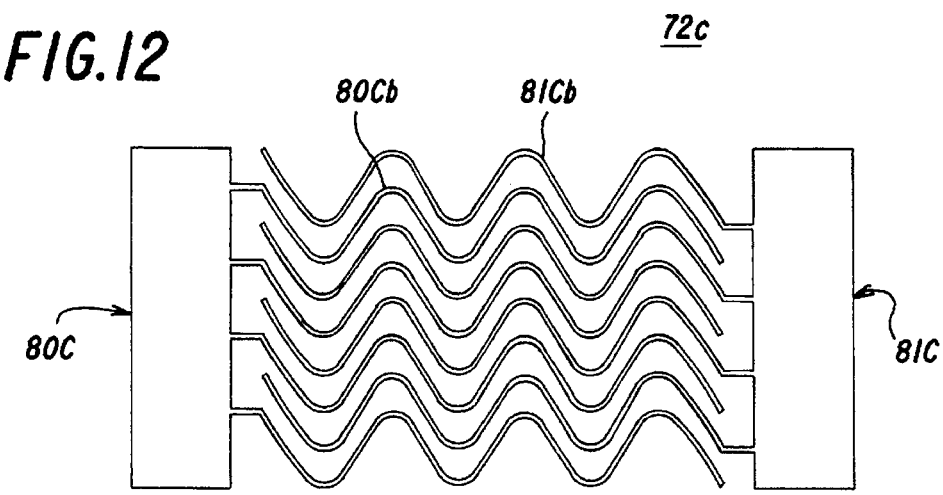
FIG. 12 shows a third modification of the decoupling capacitance shown in FIG. 4.

FIG. 12 shows a third modification of the decoupling capacitance 72. A decoupling capacitance 72C as the third modification comprises interdigital electrodes 80C, 81C. The interdigital electrode 80C has tooth parts 80C$b$ having a sine-wave shape, and the interdigital electrode 81C has tooth parts 81C$b$ also having the sine-wave shape.

The tooth parts 80C$b$ are alternately facing the tooth parts 81C$b$. An area along between the tooth part 80C$b$ and the tooth part 81C$b$ is wider than that of straight tooth parts. Therefore, the decoupling capacitance 72C has a larger capacitance compared to the decoupling capacitance 72 shown in FIG. 4A.

ii) A Modification of the Insulating Layers 73-1 to 73-3

For a material of the coated insulating-layer part 101 shown in FIG. 6, a material such as polyimide resin, epoxy resin, or spin-on glass (SOG) as well as the BCB may be applied.

iii) Modifications of the Via Structure Section 75

In FIG. 8, no via is formed between the four arm parts 111-1-1 to 111-4-1 of the pads for a via 111-1 to 111-4. Therefore, a via may be additionally formed between, for example, the arm parts 111-2-1 and 111-3-1. In this case, the second pad for a via 111-2 and the third pad for a via 111-3 are connected to each other through the two vias. In this way, since the pads for a via are connected to each other in two positions, electrical connections in the via structure section 75 may have a high reliability.

Figure 13:
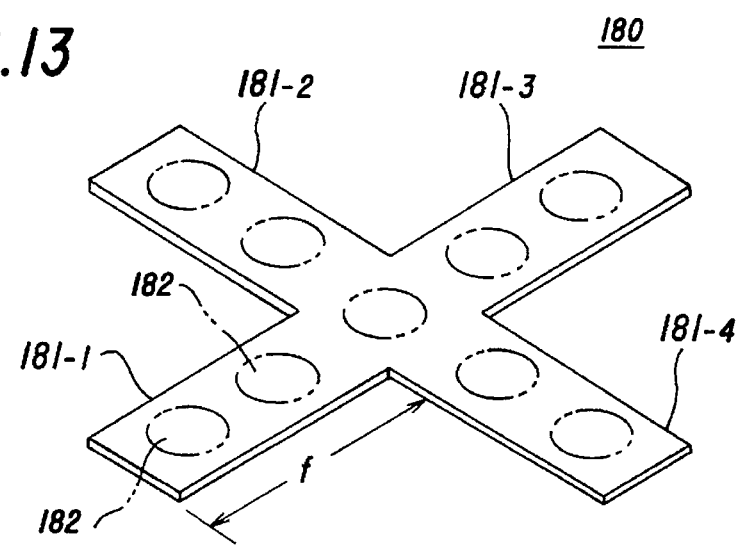
FIG. 13 shows a pad for a via used in a first modification of the via structure section shown in FIG. 8.

FIG. 13 shows a pad for a via used in a first modification of the via structure section 75. A pad for a via 180 has arm parts 181-1 to 181-4 in a radial manner for four directions. Each of the arm parts 181-1 to 181-4 has a length f, and has two parts 182 in which two vias can be formed.

Figure 14:
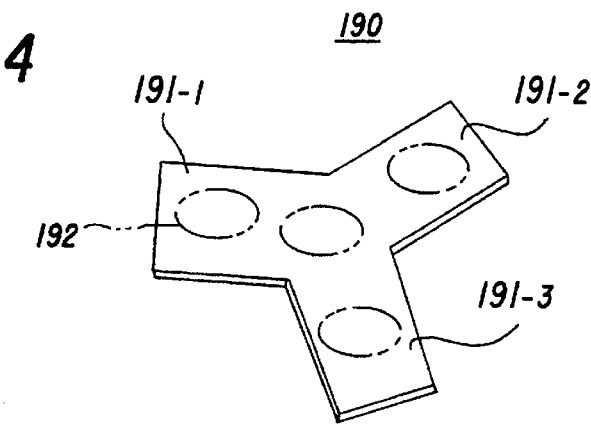
FIG. 14 shows a pad for a via used in a second modification of the via structure shown in FIG. 8.

FIG. 14 shows a pad for a via used in a second modification of the via structure 75. A pad for a via 190 has arm parts 191-1 to 191-3 in a radial manner for three directions. Each of the arm parts 191-1 to 191-3 has as least one part 192 in which a via can be formed.

As described above, the present inventions have the following features.

According to the present invention, the interconnection pattern in which there is no locally thinner part may be formed. Therefore, the interconnection pattern is prevented from being snapped and a high reliability of the semiconductor device may be achieved.

Further, since the abnormal heat evolution may be prevented in the semiconductor device according to the present invention, migration and degradation of the insulation of the insulating layer may also be prevented. And the above prevents the interconnection patterns facing each other from being shorted. As a result, the reliability of the semiconductor device may be further increased.

And the interconnection pattern according to the present invention may have almost the same volume resistivity as the theoretical value. Therefore, the semiconductor device may have almost the same performance as the designed value and may be fabricated with the high yield.

According to the present invention, since the surface of the coated insulating-layer part may be flat, the interconnection pattern may be formed with a uniform thickness and a uniform width.

According to the present invention, since the vias may be formed without influence from each other, the whole vias may have a regular-size configuration. As a result, the electrical connection reliability of the vias may be increased.

According to the present invention, since the interval between the adjoining tooth parts may be accurately determined, the decoupling capacitance may be formed with the high yield. And when portions of the tooth parts are shorted to each other, it is easy to find a shorted position. Further, it is easy to repair the shorted position by cutting the shorted part of the tooth part.

Therefore, the fabrication cost of the semiconductor device may be reduced.

According to the present invention, since the capacitance of the decoupling capacitance may be effectively enlarged, the transmission performance of the high-frequency signal in the semiconductor device may be improved.

Further, the present invention is not limited to these embodiments, but various variations and modifications may be made without departing from the scope of the present invention.

What is claimed is:

1. A semiconductor apparatus comprising:

a semiconductor element; and a substrate having a substrate base and a thin-film multilayer interconnection layer formed on the substrate base, said thin-film multilayer interconnection layer having:

insulating layers; and interconnection patterns, said insulating layers and said interconnection patterns being alternately layered;

wherein each of said insulating layers comprises:

a first insulating layer part substantially covering said interconnection pattern; and a second insulating layer part provided directly on the first insulating layer part to substantially cover the first insulating layer part;

wherein said thin-film multilayer interconnection layer is in the absence of an empty space; and a surface of the second insulating layer part is more flat than that of the first insulating layer part, and each of said interconnection patterns is arranged on the surface of said second insulating layer part.

2. The semiconductor apparatus as claimed in claim 1, wherein said first insulating layer part is made of blended resin with which an additive is blended, and said second insulating layer part is made of an insulating material with which no additive is blended.

3. The semiconductor apparatus as claimed in claim 1, wherein said second insulating layer part has a thinner thickness than that of said first insulating layer.

4. The semiconductor apparatus as claimed in claim 1, wherein said first insulating layer part is made of at least one of materials of benzocyclobutene (BCB), polyimide resin, epoxy resin, and spin-on glass (SOG).

5. A semiconductor apparatus comprising:

a semiconductor element; and a substrate having a substrate base and a thin-film multilayer interconnection layer formed on the substrate base, said thin-film multilayer interconnection layer having:

insulating layers;

interconnection patterns; and a via structure section, said insulating layers and said interconnection patterns being alternately layered;

wherein said via structure section comprises:

a plurality of pads which are alternately layered with said insulating layers, each of said pads including a plurality of arm parts extending in a radial manner outwardly, wherein said arm parts of said pads are arranged so as to overlap each other through said insulating layers; and vias, formed in said insulating layers, electrically being directly connected to said arm parts of the pads together, wherein said vias are arranged so as not to overlap each other.

6. A semiconductor apparatus comprising:

a semiconductor element, and a substrate having a substrate base and a thin-film multilayer interconnection layer formed on the substrate base, said thin-film multilayer interconnection layer having:

insulating layers;

interconnection patterns; and a decoupling capacitance, said insulating layers and said interconnection patterns being alternately layered;

wherein said decoupling capacitance comprises:

a pair of interdigital electrodes respectively including tooth parts which are alternately arranged, and a dielectric part filling a gap between adjoining tooth parts; wherein a value of the decoupling capacitance may relatively increase.

7. The semiconductor apparatus as claimed in claim 6, wherein each of said interdigital electrodes comprises a tooth part of a bending form.

8. The semiconductor apparatus as claimed in claim 6, wherein each of said interdigital electrodes has a thinner thickness than that of said decoupling capacitance.

* * * * *